United States Patent
Thallner

(10) Patent No.: US 6,792,991 B2
(45) Date of Patent: Sep. 21, 2004

(54) DEVICE FOR DETACHING A CARRIER FROM A SEMI-CONDUCTOR DISK

(76) Inventor: Erich Thallner, Bubing 71, 4780 Schärding (AT)

(*) Notice: Subject to any disclaimer, the term of this patent is extended or adjusted under 35 U.S.C. 154(b) by 34 days.

(21) Appl. No.: 10/158,315

(22) Filed: May 30, 2002

(65) Prior Publication Data
US 2002/0185644 A1 Dec. 12, 2002

(30) Foreign Application Priority Data
Jun. 7, 2001 (AT) .......................................... A 886/2001

(51) Int. Cl.$^7$ ............................ B32B 31/00; B32B 35/00
(52) U.S. Cl. ................... 156/539; 156/230; 156/247; 156/344; 156/584
(58) Field of Search ..................... 156/230, 247, 156/344, 541, 542, 552, 584, 539

(56) References Cited

U.S. PATENT DOCUMENTS

| | | | | |
|---|---|---|---|---|
| 4,696,712 A | * | 9/1987 | Nonaka | 156/351 |
| 5,268,065 A | * | 12/1993 | Grupen-Shemansky | 438/118 |
| 5,286,329 A | * | 2/1994 | Iijima et al. | 156/297 |
| 5,494,549 A | * | 2/1996 | Oki et al. | 156/268 |
| 6,238,515 B1 | * | 5/2001 | Tsujimoto et al. | 156/379.8 |
| 6,569,282 B1 | * | 5/2003 | Arisa | 156/345.21 |
| 2003/0088959 A1 | * | 5/2003 | Tsujimoto | 29/25.01 |

FOREIGN PATENT DOCUMENTS

| | | |
|---|---|---|
| DE | 2826110 | 12/1978 |
| DE | 3427870 A1 | 3/1986 |
| DE | 244233 A1 | 3/1987 |
| DE | 4142272 A1 | 2/1993 |
| DE | 19856393.0 A1 | 6/1999 |
| JP | 59031027 A | 2/1984 |
| JP | 2000174100 A | 6/2000 |

* cited by examiner

*Primary Examiner*—Mark A. Osele
(74) *Attorney, Agent, or Firm*—Kusner & Jaffe

(57) ABSTRACT

The invention concerns a device for detaching a carrier that has been temporarily fixed on the top-most surface of a semi-conductor wafer from the semi-conductor wafer.

11 Claims, 3 Drawing Sheets

DEVICE FOR DETACHING A CARRIER FROM A SEMI-CONDUCTOR DISK

FIELD OF THE INVENTION

The invention concerns a device for detaching a carrier that has been temporarily fixed on the upper surface of a semi-conductor disk. The term 'semi-conductor disk', according to the invention, covers all types of carrier plates or substrate disks.

BACKGROUND OF THE INVENTION

Mostly thin and/or large semi-conductor disks (wafers) are very difficult to handle. For example, when necessary to manufacture and/or process a wafer with thickness of <100 $\mu$m, it is a known fact that one has to first start with a "raw piece" of higher thickness (for example 600 $\mu$m) and then treat it according to the following procedure (FIG. 5):

You have to first arrange for electrical/electronic structures "S" on a surface of the wafer (FIG. 5a).

Thereafter, a protection/adhesive layer "K" is applied on this surface (so-called "protective resist") (FIG. 5b).

Thereafter, a so-called carrier C is bonded to the above mentioned protective/adhesive resist (so-called "bonding process") (FIG. 5c). While doing so, the carrier can be alternatively or cumulatively equipped with a corresponding adhesive surface F. The carrier enables easier handling of the unit, prepared by wafer and carrier (so-called "stack").

The wafer can now be processed ("reduced") in its structure-free area to the desired final thickness. This can be done, for example, through grinding, etching, and/or polishing, so-called "back-thinning"—FIG. 5d. This "back-thinning" is done until the area of the aforementioned structures "S" is reached.

In the next procedural step, electrical connections E and/or other structures are arranged on the now exposed second surface of the wafer (FIG. 5e).

For further processing/transportation steps, it is necessary to detach the carrier C again from the semi-conductor article. This is extremely difficult because the wafer that has now been reduced, for example, to a thickness of <100 $\mu$m is highly sensitive. This is mostly true for brittle semi-conductor materials, for example wafer made of gallium arsenide.

It is known that for the above-mentioned bonding between wafer and carrier adhesives or adhesive strips that lose their bonding capacity under heat may be used. The carrier can then be mechanically detached from the wafer. The problem, however, is then of transporting the extremely thin wafer safely to the next processing stages. Mechanical gripper devices are no solution to this problem because they cause mechanical stresses in the wafer that can eventually cause the wafer to break.

It is one object of the present invention to provide a possibility of not only safely detaching a temporarily fixed carrier from a first surface of a semi-conductor wafer but also of transporting it to the other processing stages without causing any damage to the wafer.

SUMMARY OF THE INVENTION

The basic idea of this invention is to arrange the unit including the wafer and carrier (the "stack") on another carrier device before detaching the carrier from the wafer and while doing so, temporarily fixing the wafer once again on its surface opposite to the carrier. In one respect, this enables easy detachment of the carrier from the wafer. In another respect, the wafer is then directly made available in a customized and defined position for further processing stages, including transport.

Specifically, it is proposed that the stack be positioned within a frame and aligned vis-à-vis the frame. Later, a foil should be made available that is bonded to the center of the second surface of the wafer opposite to the carrier and to the outer side of the frame.

If the carrier is then detached from the wafer using known methods, the wafer, now arranged in the described further treatment and transport device, comprising the foil and frame, is directly available for further processing steps. The wafer can be transported along with the frame to a subsequent cutting unit or the like, without the wafer itself being subjected to any mechanical stress, where the wafer that is still arranged on the foil, is cut into so-called chips.

These chips that are generally of a size of a few cm$^2$ feature a sufficient degree of resistance to bending due to their small size so that they can then be mechanically separated from the foil.

If required, the surface of the wafer facing the carrier can be cleaned beforehand. Even for this step, the customized unit comprising of frame and foil is a major help.

In its most general embodiment, the invention concerns a device for detaching a carrier that has been temporarily fixed on a first surface of a semi-conductor disk from the semi-conductor disk with the following features:

a first device (device 1) for guiding a frame with upper and lower sides, a second device (device 2) for guiding the semi-conductor disk with the carrier into a space limited by the frame, a third device (device 3) for a flush alignment of an inner near edge surface of the frame with a second surface of the semiconductor disk that is turned away from the carrier, a fourth device (device 4) for guiding a foil that has at least a partial adhesive layer on at least one of its main surfaces, a fifth device (device 5) for forming an adhesive bond between the surface of the foil with said adhesive and the second surface of the semi-conductor disk and the inner, near edge upper side of the frame, and a sixth device (device 6) for detaching the carrier from the semiconductor disk.

The scope of the invention includes the development of at least one of the mentioned devices including at least one function of another device. Thus, one of the devices 1 to 3 can be constructed in such a way that it includes at least one function of the other device. Thus, the second device used for guiding the wafer with carrier (stack) into the space limited by the frame can be simultaneously used for the fleeting alignment of the inner surface close to the edge of the frame with the second surface of the wafer that is turned away from the carrier, i.e., simultaneously take over the function of the third device.

Similarly, the fourth and fifth devices can be combined to form one device that fulfills both the functions.

According to one embodiment, at least one of the devices 1, 2 or 6 comprise a gripper. This gripper device can be used for placing the frame or the unit wafer/carrier unit onto a table. This can be done by simultaneously performing the function of the third device so that the corresponding surfaces of frame and wafer are arranged flush. The fourth unit may comprise a pull-off unit that leads the foil from a roll over the frame and wafer and then presses the foil by itself (rolls) or with the help of another device onto the mentioned surface sections of said frame and wafer and also cuts the foil, if required.

The foil has at least some adhesive areas on the side facing the wafer and frame. It can be made of some plastic base material, say PVC, and an adhesive coating.

As soon as the foil is stuck onto the frame or the second wafer surface, respectively, the carrier may be detached from the wafer using known methods, for example by heating, with UV-light or a solvent. While doing so, it remains bonded to the foil that has in turn been fixed to the frame.

In order to detach the carrier, the entire unit comprising frame, foil, wafer and carrier can be turned by 180° if required. The lower side then lies on the top.

In order to simplify the process of positioning the wafer in the opening of the frame, one embodiment provides to arrange the wafer with a certain distance to the inner edge of the frame. In other words, the diameter of a wafer, typically of circular shape, is less than the internal diameter of the frame.

Other features of the invention result from the features of the sub-claims and other application documents.

BRIEF DESCRIPTION OF THE DRAWINGS

The invention is described in the following in detail on the basis of a model. The schematic diagrams depict the following.

DETAILED DESCRIPTION OF PREFERRED EMBODIMENT

Figure 1:
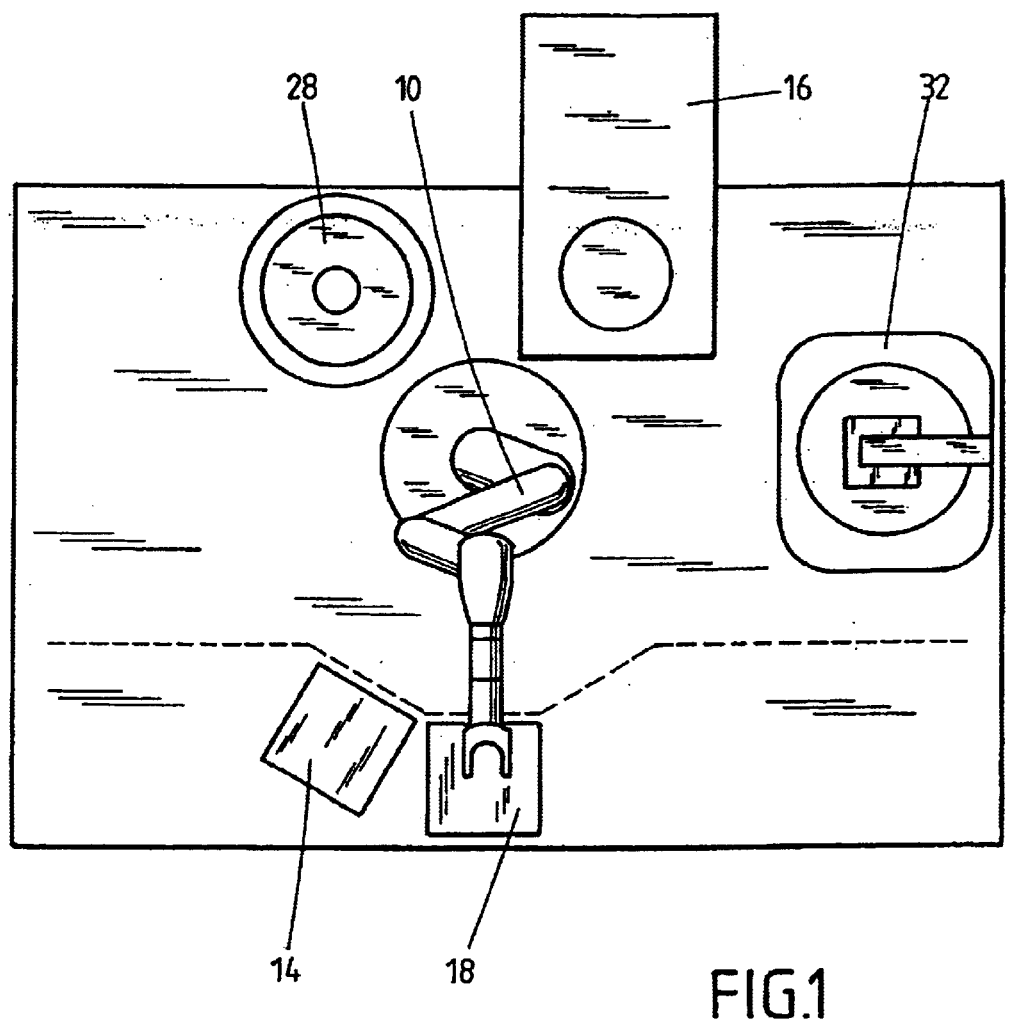
FIG. 1 is a schematic diagram of a device corresponding to the invention.

FIG. 1 shows a gripper 10 that places a frame 12 (FIGS. 2 to 4) from a cassette 14 in a unit 16 onto a table T. The gripper 10 fulfills the function of the first device according to the given description.

The gripper 10 also simultaneously fulfils the function of the second device and assists in guiding a so-called stack (component made of wafer and carrier) from a depot 18 to the unit 16 and, as shown in the Figure, placing it in a circular space 20 formed by the frame 12.

The gripper 10 also takes over the function of the mentioned third device and softly aligns the inner surface 12o close to the edge of the frame 12 with the second surface 24o of the wafer 24 that faces away from the carrier 22 within the unit 16 on the mentioned table T.

The gripper 10 finally removes a circular foil 26 from a pile 28 and places it onto a surface 24o of the wafer 24 and the inner region, close to the edge of frame 12. A roll shown in FIG. 2 and marked "30" that has the function of the fifth device then travels over the foil 26 that has an adhesive coating on its main surface facing the wafer 24 and the frame 12. By these means, the foil 26 is temporarily bonded onto the frame 12 and the wafer surface 24o.

Figure 2:
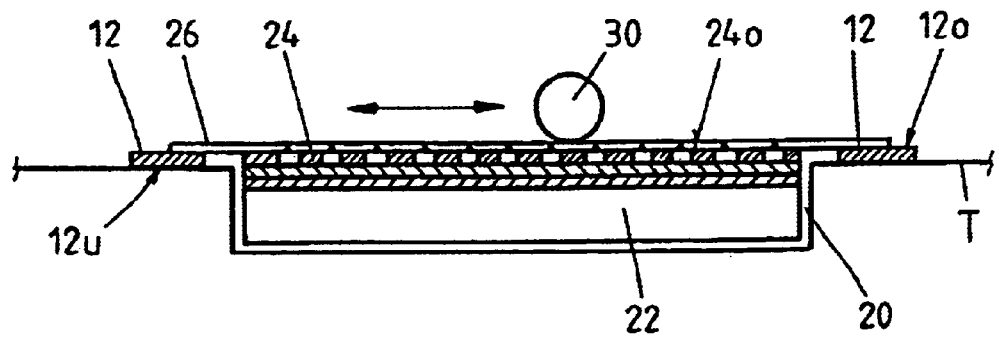
FIG. 2 is a view showing the arrangement of wafer and carrier in a frame on a foil.
Figure 3:
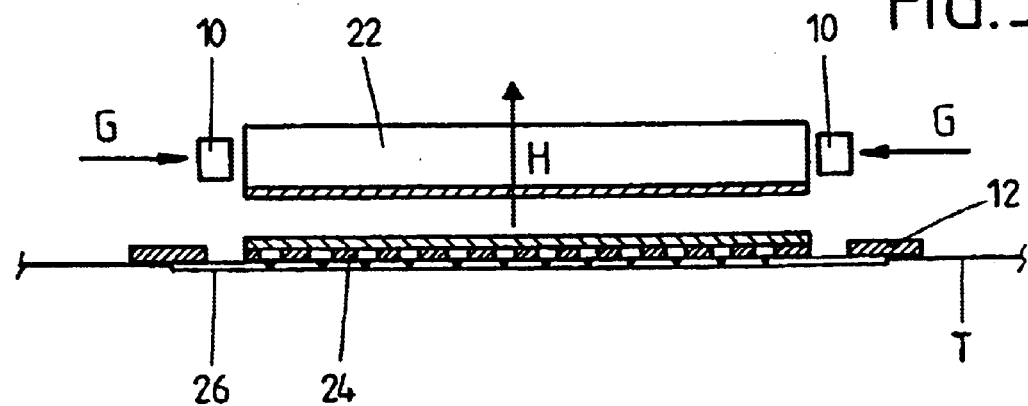
FIG. 3 shows the detachment of the carrier from wafer.

Finally, the gripper also takes over the function of the sixth device and transports the wafer/carrier combination shown in FIG. 2, being bonded onto foil 26 in said frame 12, to device part 32 (so-called "de-bonder") whereby the gripper arm rotates 180° on its transport path.

After detaching the gripper, the foil 26 and/or the frame 12 lies on a table with the carrier 22 on the top. It is then heated in the device part 32 so that the adhesive function between carrier 22 and wafer 24 is eliminated. The gripper 10 can then grip the carrier 22 (arrow G) and lift it upwards (arrows H in FIG. 3).

Figure 4:
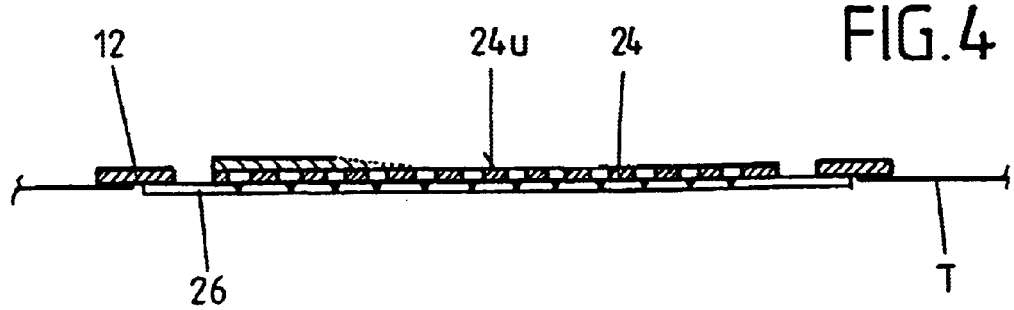
FIG. 4 shows the arrangement of only the wafer on the foil in the frame.
Figure 5A:
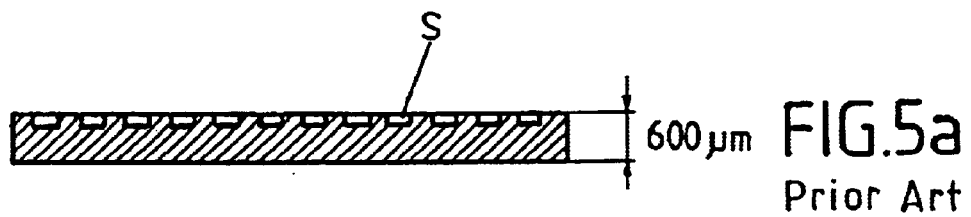
FIGS. 5a–5e illustrate steps for forming a thin wafer using a carrier.
Figure 5B:
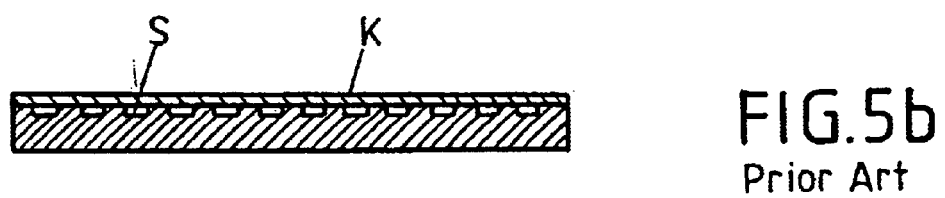
Figure 5C:
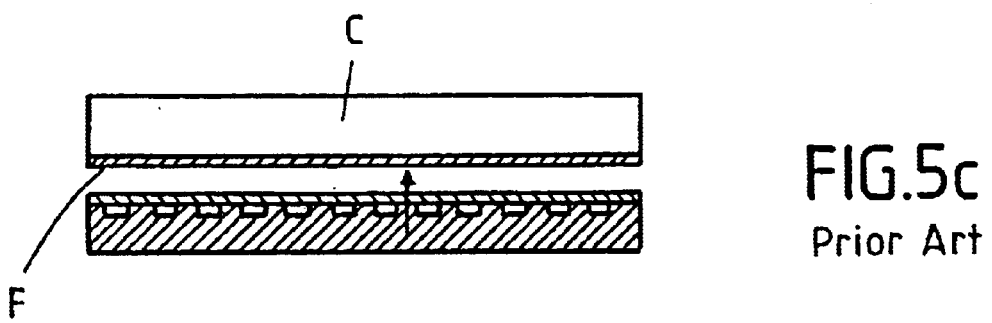
Figure 5D:
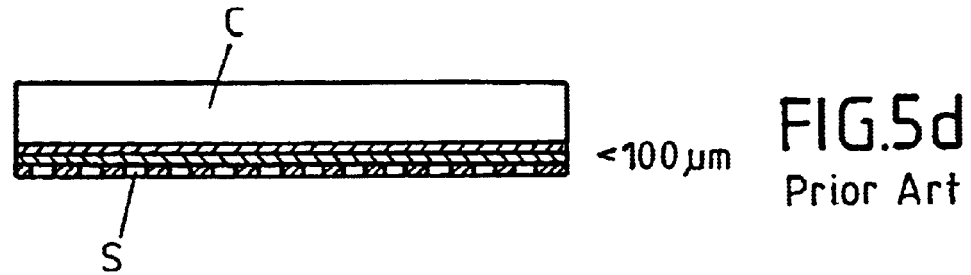
Figure 5E:
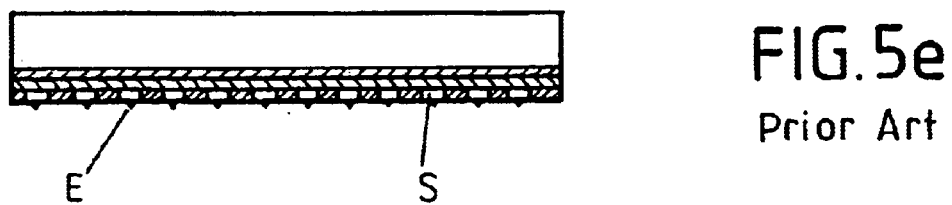

What remains is frame 12 with the adhesive foil 26 and the wafer 24 stuck to foil 26 (FIG. 4). Thereafter, the first surface 24a of the wafer can be cleaned of all residues of the adhesive.

After this, the unit shown in FIG. 4 is available for all further processing steps. The gripper 10 can then grip the frame 12 and transports the wafer 24 to a subsequent cutting unit where the wafer will be cut into chips that are then detached from the foil 26.

Having described the invention, the following is claimed:

1. A device for detaching a carrier (22) that has been temporarily fixed on a first surface (24u) of an undivided semiconductor disk (24) from the undivided semiconductor disk (24) with the following features:
   a first device (10) for guiding a frame (12) with upper and lower sides (12o and 12u);
   a second device (10) for guiding the undivided semiconductor disk (24) with said carrier (22) into a space (20) defined by the frame (12);
   a third device (10) for flush alignment of an inner, near-edge surface (12o) of the frame (12) with a second surface (24o) of the undivided semiconductor disk (24) that is turned away from the carrier (22);
   a fourth device (10) for guiding a foil (26) that has at least a partial adhesive layer on at least one of its main surfaces;
   a fifth device (10) for forming an adhesive bond between the surface of the foil (26) with said adhesive and the second surface (24o) of the undivided semiconductor disk (24) and the inner, near-edge upper side (12o) of the frame; and
   a sixth device (10) for detaching the carrier (22) from the undivided semiconductor disk (24) wherein said sixth device (10) detaches said carrier (22) from the undivided semiconductor disk (24), by gripping said carrier (22) and lifting said carrier (22) in a direction generally perpendicular to the undivided semiconductor disk (24).

2. Device according to claim 1 whereby at least one of the first to sixth devices is constructed in such a way that it assumes at least one of the functions of any other of said devices.

3. Device according to claim 1 whereby at least one of the first to third devices (10) is constructed in such a way that it assumes at least one of the functions of another of these devices (10).

4. Device according to claim 1 whereby one of the fourth or fifth devices (10) assumes the function of the respective other device (10).

5. Device according to claim 1 whereby at least one of the first, second or sixth devices (10) is a gripper device.

6. Device according to claim 1 whereby the fifth device (30) comprises a pressure roller.

7. Device according to claim 1 whereby the third device (10) guides the semiconductor disk (24) into the frame (12) in a position at a distance to an inner edge of said frame (12).

8. Device according to claim 1 whereby the first and second device (10) deposit the frame (12) or the semiconductor disk (24) with carrier (22) onto a table (T).

9. Device according to claim 1 whereby the fourth device (10) guides the foil (26) from the top in the direction of the frame (12) and the second surface (24*o*) of the wafer (24).

10. Device according to claim 1 where the sixth device (30) presses the foil (26) from the top in the direction of the frame (12) and the second surface (24*o*) of the wafer (24).

11. Device according to claim 1, wherein said semiconductor disk (24) is back-thinned after said carrier (22) has been temporarily fixed on the first surface (24*u*) of said semi-conductor disk (24).

* * * * *